(12) United States Patent
Seo et al.

(10) Patent No.: US 7,863,914 B2
(45) Date of Patent: Jan. 4, 2011

(54) METHOD FOR TESTING SEMICONDUCTOR MEMORY DEVICE USING PROBE AND SEMICONDUCTOR MEMORY DEVICE USING THE SAME

(75) Inventors: Young-hun Seo, Suwon-si (KR); Won-kyung Chung, Suwon-si (KR); Han-na Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 262 days.

(21) Appl. No.: 12/003,899

(22) Filed: Jan. 3, 2008

(65) Prior Publication Data

US 2008/0164897 A1    Jul. 10, 2008

(30) Foreign Application Priority Data

Jan. 8, 2007    (KR) ................. 10-2007-0002180

(51) Int. Cl.
*G01R 31/02* (2006.01)
(52) U.S. Cl. ..................................... 324/754
(58) Field of Classification Search ......... 324/754–765; 257/48; 438/14–18
See application file for complete search history.

(56) References Cited

U.S. PATENT DOCUMENTS

| | | | |
|---|---|---|---|
| 4,220,917 A * | 9/1980 | McMahon, Jr. ............ 324/555 |
| 6,577,149 B2 * | 6/2003 | Doong et al. ............... 324/765 |
| 6,674,295 B1 * | 1/2004 | Kamitani .................... 324/713 |
| 6,774,649 B2 * | 8/2004 | Hartmann ................... 324/754 |
| 6,791,344 B2 * | 9/2004 | Cook et al. .................. 324/754 |
| 7,061,256 B2 * | 6/2006 | Hasegawa ................... 324/719 |
| 7,141,995 B2 * | 11/2006 | Yamashita et al. .......... 324/754 |
| 7,375,508 B2 * | 5/2008 | Bucksch ................... 324/158.1 |
| 7,388,365 B2 * | 6/2008 | Nokuo et al. ............. 324/158.1 |
| 2002/0190737 A1 | 12/2002 | Maekawa et al. |
| 2005/0258854 A1 | 11/2005 | Kim et al. |
| 2006/0186907 A1 * | 8/2006 | Haetty ........................ 324/756 |

FOREIGN PATENT DOCUMENTS

JP    2002-318263    10/2002
KR    10-2005-0110304    11/2005

* cited by examiner

*Primary Examiner*—Ha Tran T Nguyen
*Assistant Examiner*—Arleen M Vazquez
(74) *Attorney, Agent, or Firm*—Lee & Morse, P.C.

(57) ABSTRACT

Example embodiments relate to a semiconductor memory device including a first pad having a probe region and a sensing region, the first pad may be adapted to come in contact with a primary probe, a sensing unit adapted to sense a weak contact of the first pad and the primary probe, the sensing unit may generate an output current in response to a contact point of the primary probe, and a second pad may be adapted to come in contact with a secondary probe to input/output an electric signal. The output current of the sensing unit may be output through the second pad or the secondary probe.

25 Claims, 6 Drawing Sheets

METHOD FOR TESTING SEMICONDUCTOR MEMORY DEVICE USING PROBE AND SEMICONDUCTOR MEMORY DEVICE USING THE SAME

BACKGROUND OF THE INVENTION

1. Field of the Invention

Example embodiments relate to a method of testing semiconductor memory devices. More particularly, example embodiments relate to a method for determining whether a probe provides a weak contact with a pad of a semiconductor memory device, and a semiconductor memory device using the same 2. Description of the Related Art Generally, in order to test a semiconductor memory device, an electric signal may be applied to pads of the semiconductor memory device to determine whether data output from the semiconductor memory device is normal. Accordingly, a device, e.g., a probe, may come into contact with the respective pads so that the electric signal may be applied to the pads. However, as capacity of the semiconductor memory device increases, the number of pads receiving and outputting electric signals also increases. Thus, in order to reduce the testing time, the probes may come into contact with the pads simultaneously. However, because the number of pads simultaneously coming into contact with the probes increases, it may be difficult to correctly align the probes to with the respective pads.

Further, testing may be conducted numerous times and, thus, it may also be difficult to repeatedly bring the probes into correct contact with the respective pads, e.g., if a probe comes into contact with an edge of the pad, a problem may occur.

FIG. 1 illustrates pads of a related art semiconductor memory device and probes for testing the related art semiconductor memory device. Referring to FIG. 1, the related art semiconductor memory device may include a sensor pad 110 and pads 115_1 and 115_2 in order to perform a test. The pads 115_1 and 115_2 may be used to input/output an electric signal to/from the semiconductor memory device, and the sensor pad 110 may be used to determine whether probes 155_1 and 155_2 correctly come into contact with the pads 115_1 and 115_2.

The sensor pad 110 may include a probe region 111 and a sensing region 112. The probe region 111 may normally come into contact with a probe 150. The sensing region 112 may surround the probe region 111, and may determine whether a probe 150 is out of the probe region 111. The probe region 111 may be formed of an insulating material, and the sensing region 112 may be formed of a conductive material.

The related art semiconductor memory device may be tested by applying a current to the probe 150 coming into contact with the sensor pad 110, and measuring a voltage of the sensor pad 110, e.g., the current may not flow through the sensor pad 110 when the probe 150 normally comes into contact with the probe region 111, or the current may flow through the sensor pad 110 when the probe 150 abnormally comes into contact with the sensing region 112. Accordingly, the voltage measured from the sensor pad 110 may depend on whether the probe 150 normally (or abnormally) comes into contact with the probe regions 111, 112. However, an additional channel CH1 may be required for the sensor pad 110, e.g., the channel CH1 for measuring the current or voltage of the sensor pad 110 must be added to channels CH2 and CH3 used to measure the currents or voltages of pads 115_1 and 115_2.

Another possible test method is to apply a current or a voltage to the probe 150 and measure the voltage or current of one of the normal pads 115_1 and 115_2. However, although an additional channel, e.g., channel CH1, may not be needed, it may be impossible to determine whether the probe 150 correctly comes into contact with the sensor pad 110 when an impeding substance, e.g., dust, exists on the sensor pad 110. In particular, even when the probe 150 normally comes into contact with the probe region 111, a voltage or current may be measured from pads 115_1 and 115_2 due to conductivity of the impeding substance (e.g., dust) on the probe region 111 of the sensor pad 110. Accordingly, the normal contact of the probe 150 with the sensor pad 110 may be sensed as having an abnormal contact because impeding substances on the probe region 111 may exist.

SUMMARY OF THE INVENTION

Example embodiments are therefore directed to a semiconductor memory device and method thereof, which substantially overcome one or more of the problems due to the limitations and disadvantages of the related art.

It is therefore a feature of example embodiments to provide a semiconductor memory device to determine whether dust exists on a sensor pad.

It is therefore another feature of example embodiments to provide a semiconductor memory device to determine whether a probe correctly comes into contact with a sensor pad without requiring a separate channel for the sensor pad.

It is therefore another feature of example embodiments to provide a method for testing whether a probe correctly comes into contact with a sensor pad.

At least one of the above and other features of example embodiments may be provided by a semiconductor memory device including a first pad having a probe region and a sensing region, the first pad may be adapted to come in contact with a primary probe, a sensing unit may be adapted to sense a weak contact of the first pad and the primary probe, the sensing unit may generate an output current in response to a contact point of the primary probe, and a second pad may be adapted to come in contact with a secondary probe to input/output an electric signal. The output current of the sensing unit may be output through the second pad or the secondary probe.

The sensing unit may generate the output current in response to a first voltage corresponding to a voltage obtained by dividing a power supply voltage using a resistance component, generated in response to a contact point of the primary probe, and a plurality of resistors.

The sensing unit may include a voltage matching unit adapted to output a voltage in response to a contact point of the primary probe, and a current generator adapted to generate the output current corresponding to the output voltage of the voltage matching unit.

The voltage output from the voltage matching unit may correspond to a voltage obtained by dividing a power supply voltage using a resistance component, generated in response to the contact point of the primary probe, and a plurality of resistors.

The voltage matching unit may include a plurality of resistors, a comparator adapted to compare a voltage obtained by dividing a power supply voltage using a resistance component, generated in response to the contact point of the primary probe, and a plurality of resistors to the output voltage of the voltage matching unit, and a transistor having a gate adapted to receive the output signal of the comparator, a first terminal to which the power supply voltage is applied, and a second terminal connected to a source of the ground voltage and an output terminal of the voltage matching unit.

The current generator may include a transistor having a gate adapted to receive the output voltage of the voltage matching unit, a first terminal to which the power supply voltage is applied, and a second terminal connected to the second pad.

The semiconductor memory device may further include a controller adapted to control operation of the sensing unit in response to a test signal. The controller may include a transistor having a gate receiving the test signal, a first terminal receiving the power supply voltage, and a second terminal connected to the output terminal of the voltage matching unit and an input terminal of the current generator.

The sensing unit may compare a first voltage generated according to a resistance component in response to the contact point of the primary probe and a plurality of variable resistors, to a reference voltage, and may generate an output current having a first logic state or a second logic state.

The first voltage may correspond to a voltage obtained by dividing a power supply voltage using the resistance component generated in response to the contact point of the primary probe and the plurality of variable resistors.

The sensing unit may include a voltage matching unit comparing the first voltage to the reference voltage and outputting a voltage having a first logic state or a second logic state, and a current generator generating the output current having the first logic state or the second logic state in response to the output voltage of the voltage matching unit.

The voltage matching unit may include a plurality of variable resistors, and a comparator comparing the first voltage to the reference voltage.

The voltage matching unit may further include an inverter inverting an output signal of the comparator.

At least one of the above and other features of example embodiments may be provided by a method for testing probe contact with a semiconductor memory device having a plurality of pads. The method may include applying a voltage to a primary probe coming into contact with a first pad, generating an output current in response to a contact point of the primary probe, outputting the output current through a second pad or a secondary probe coming into contact with the second pad, and determining whether a weak contact exists between the primary probe and the first pad based on the output current.

The method of generating of the output current includes generating a voltage corresponding to the contact point of the primary probe, and generating the output current corresponding to the generated voltage.

The method of generating of the voltage includes dividing a power supply voltage according to a resistance component generated in response to the contact point of the primary probe and a plurality of resistors.

The method of generating of the output current may include applying the generated voltage to a gate of a transistor that generates the output current.

The method of determining whether the weak contact exists includes determining that the primary probe is in a weak contact with the first pad when the output current is greater than a threshold value.

The method further includes controlling the generated output current in response to a test signal.

The method of generating of the output current further includes generating a voltage corresponding to a resistance component generated according to the contact point of the first probe and a plurality of variable resistors while varying the plurality of variable resistors, and comparing the generated voltage to a reference voltage and generating an output current in a first logic state or a second logic state.

The method of generating of the output current further includes applying the comparing result to a gate of a transistor and generating the output current according through the transistor.

The method of generating of the voltage includes varying the resistance of the variable resistors in response to a mode register set (MRS) signal.

BRIEF DESCRIPTION OF THE DRAWINGS

The above and other features and advantages of example embodiments will become more apparent to those of ordinary skill in the art by describing in detail example embodiments thereof with reference to the attached drawings, in which.

DETAILED DESCRIPTION OF THE INVENTION

Korean Patent Application No. 10-2007-0002180, filed on Jan. 8, 2007, in the Korean Intellectual Property Office, and entitled: "Method for Testing Semiconductor Memory Device Using Probe and Semiconductor Memory Device Using the Same," is incorporated by reference herein in its entirety Example embodiments will now be described more fully hereinafter with reference to the accompanying drawings; however, they may be embodied in different forms and should not be construed as limited to the embodiments set forth herein. Rather, these example embodiments are provided so that this disclosure will be thorough and complete, and will fully convey the scope of the invention to those skilled in the art.

Figure 1:
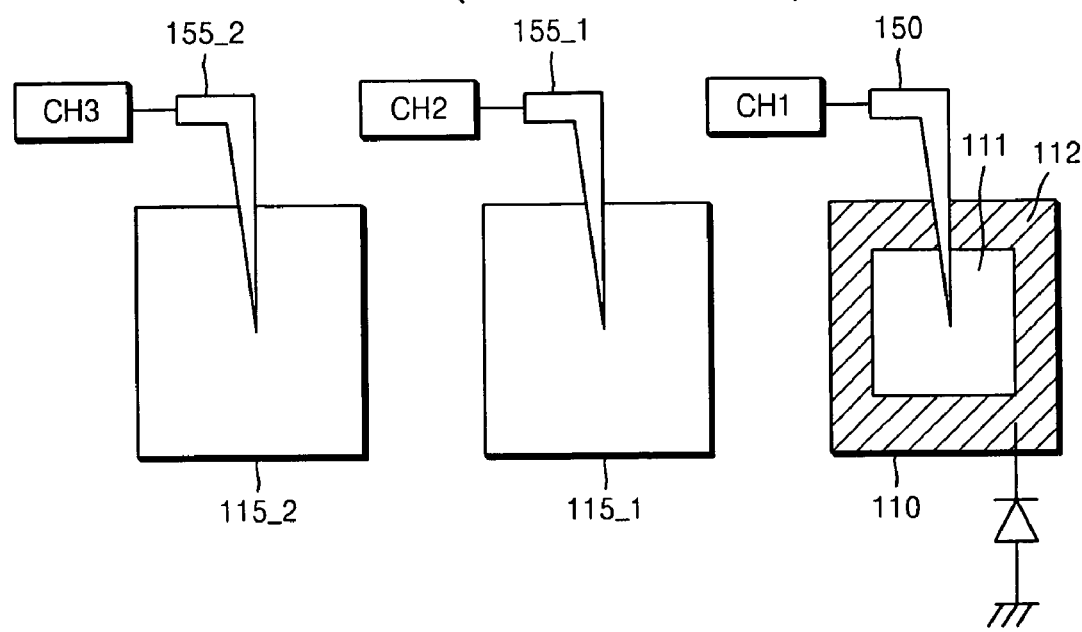
FIG. 1 illustrates pads of a related art semiconductor memory device and probes used to test the related art semiconductor memory device.
Figure 2:
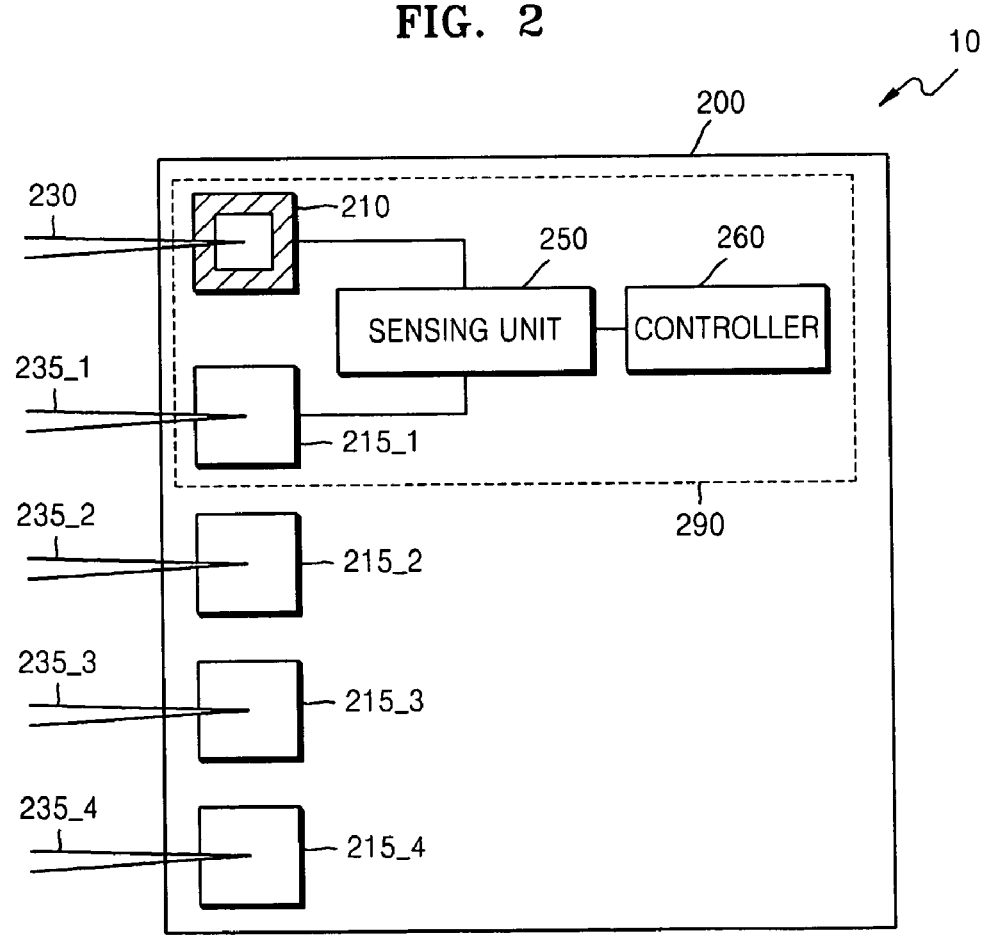
FIG. 2 illustrates a semiconductor memory device according to an example embodiment.

FIG. 2 illustrates a testing semiconductor memory device 10 including a semiconductor memory device 200 according to an example embodiment. Referring to FIG. 2, the semiconductor memory device 200 may include a plurality of pads 215_1, 215_2, 215_3 and 215_4, a sensor pad 210, a sensing unit 250 for determining a weak contact, and a controller 260. Further, a primary probe 230 and secondary probes 235_1, 235_2, 235_3 and 235_4 coming into contact with the sensor pad 210 and the pads 215_1, 215_2, 215_3 and 215_4, respectively, may be provided for testing the semiconductor memory device 10. A testing operation may be performed using the sensor pad 210, the pad 235_1, the sensing unit 250 and the controller 260.

The operation of the sensor pad 210, the pad 235_1, the sensing unit 250 and the controller 260 will now be explained.

Figure 3:
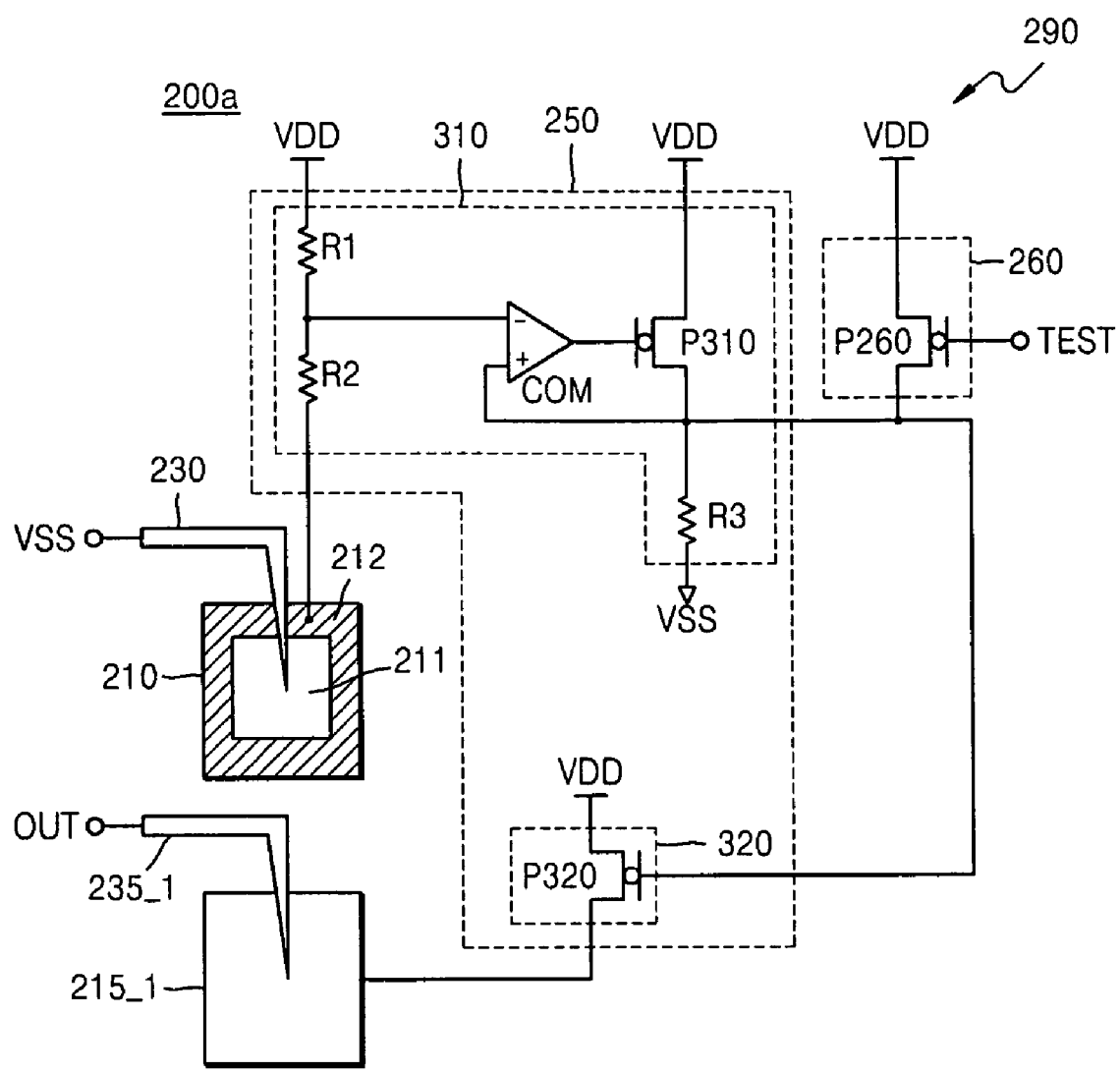
FIG. 3 illustrates a circuit diagram of a portion of the semiconductor memory device illustrated in FIG. 2 according to an example embodiment.

FIG. 3 illustrates a circuit diagram 290 of a portion of the semiconductor memory device 200a illustrated in FIG. 2 according to an example embodiment. Referring to FIG. 3, the sensor pad 210 may include a probe region 211 and a sensing region 212. The probe region 211 may normally come into contact with the primary probe 230, and the sensing region 212 may surround the probe region 211 to determine that the primary probe 230 may be out of the probe region 211. The probe region 211 may be formed of, for example, but not limited to, an insulating material, and the sensing region 212 may be formed of, for example, but not limited to, a conductive material. It should be appreciated that other materials may be employed to form the probe region 211 and the sensing region 212 of the sensor pad 210.

The sensing unit 250 may generate an output current in response to a contact point of the primary probe 230. The output current of the sensing unit 250 may be output to an output terminal OUT through the pad 215_1, and/or alternatively, through the secondary probe 235_1 coming into contact with the pad 215_1. The controller 260 may determine whether the probe contact is weak (or not), which may be performed in response to a test signal TEST.

The sensing unit 250 may further include a voltage matching unit 310 and a current generator 320. The voltage matching unit 310 may output a voltage in response to the contact point of the primary probe 230. The current generator 320 may generate the output current in response to the output voltage of the voltage matching unit 310. The circuit configurations of the voltage matching unit 310 and the current generator 320 will now be explained in more detail with reference to FIG. 4.

Figure 4:
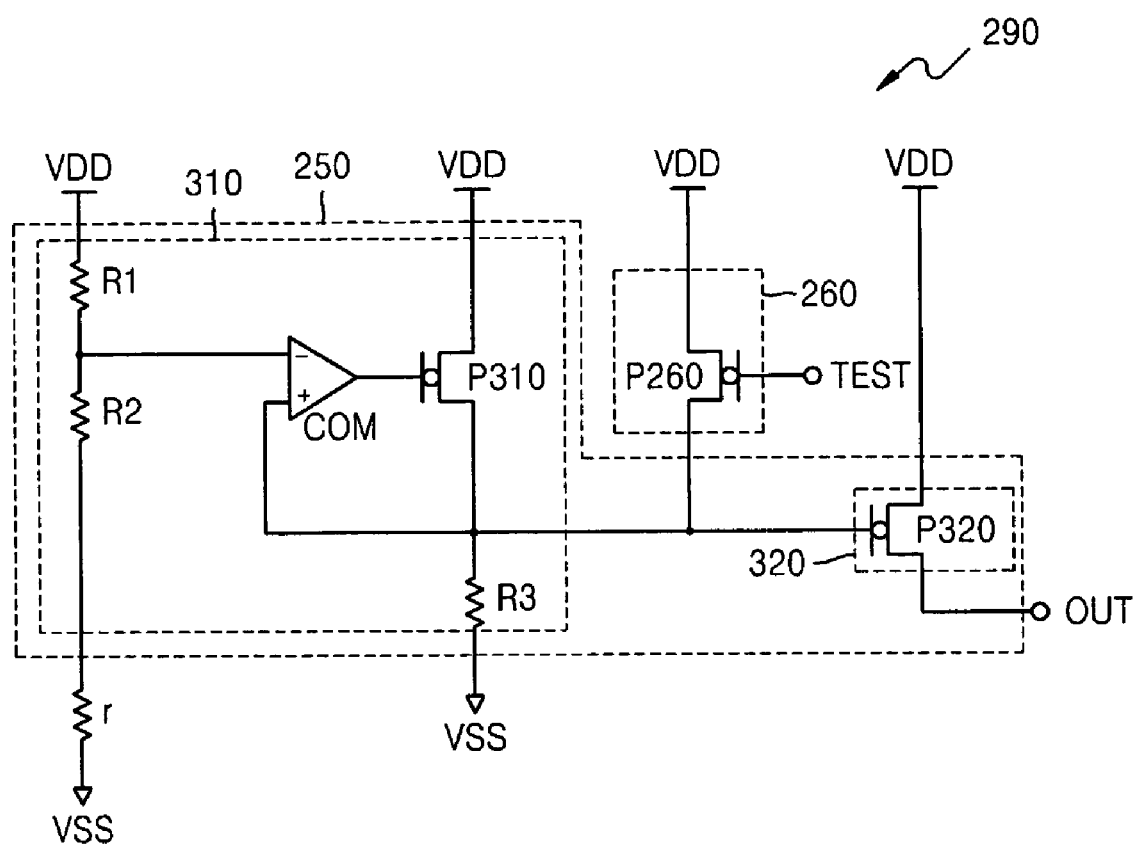
FIG. 4 illustrates an equivalent circuit diagram of the semiconductor memory device illustrated in FIG. 3.

FIG. 4 illustrates an equivalent circuit diagram 290 of a semiconductor memory device 200a illustrated in FIG. 3. Referring to FIG. 4, a resistor r may be equivalent to a resistance of the contact between the primary probe 230 and the sensor pad 210, as illustrated in FIG. 3. Thus, when the primary probe 230 normally comes into contact with the sensor pad 210, the primary probe 230 may be in contact with the probe region 211, and the equivalent resistance (r) may be large. Further, when the primary probe 230 abnormally comes into contact with the sensor pad 210, the primary probe 230 may be in contact with the sensing region 212, and the equivalent resistor r may have a small resistance (r).

Further, if the primary probe 230 comes into contact with a substance, i.e., dust, while being in contact with the probe region 211, the equivalent resistor r may have a resistance (r) that is between the large resistance corresponding to the normal contact of the primary probe 230 and the small resistance corresponding to the abnormal contact of the primary probe 230, e.g., the resistance (r) of the equivalent resistor r may depend on the contact point of the primary probe 230 and whether dust exists on the sensor pad 210.

The voltage matching unit 310 may include a plurality of resistors R1 and R2, a comparator COM and a transistor P310. The plurality of resistors R1 and R2 and the equivalent resistor r may be configured to divide a power supply voltage VDD. The comparator COM may compare the voltage divided by the resistors R1 and R2 and the equivalent resistor r to the output voltage of the voltage matching unit 310. The transistor P310 may have a gate to which the output voltage of the comparator COM may be applied, a first terminal to which the power supply voltage VDD may be applied, and a second terminal connected to a source of a ground voltage VSS and an output terminal of the voltage matching unit 310. In an implementation, the transistor P310 may be a PMOS transistor. Further, a resistor R3 may be connected between a node (where the second terminal of the transistor P310 and the output terminal of the voltage matching unit 310 are connected) and the source of the ground voltage VSS. In an implementation, the resistance (r) of the resistor R3 may be large.

The current generator 320 may include a transistor P320 having a gate, to which the output voltage of the voltage matching unit 310 may be applied, a first terminal to which the power supply voltage VDD may be applied, and a second terminal connected to the pad 215_1 (as shown in FIG. 3). The second terminal of the transistor P320 may correspond to an output terminal OUT. In an implementation, the transistor P320 may be a PMOS transistor.

The controller 260 may include a transistor P260 having a gate to which the test signal TEST may be applied, a first terminal to which the power supply voltage VDD may be applied, and a second terminal connected to the output terminal of the voltage matching unit 310 and an input terminal of the current generator 320. In an implementation, the transistor P260 may be a PMOS transistor.

Figure 5:
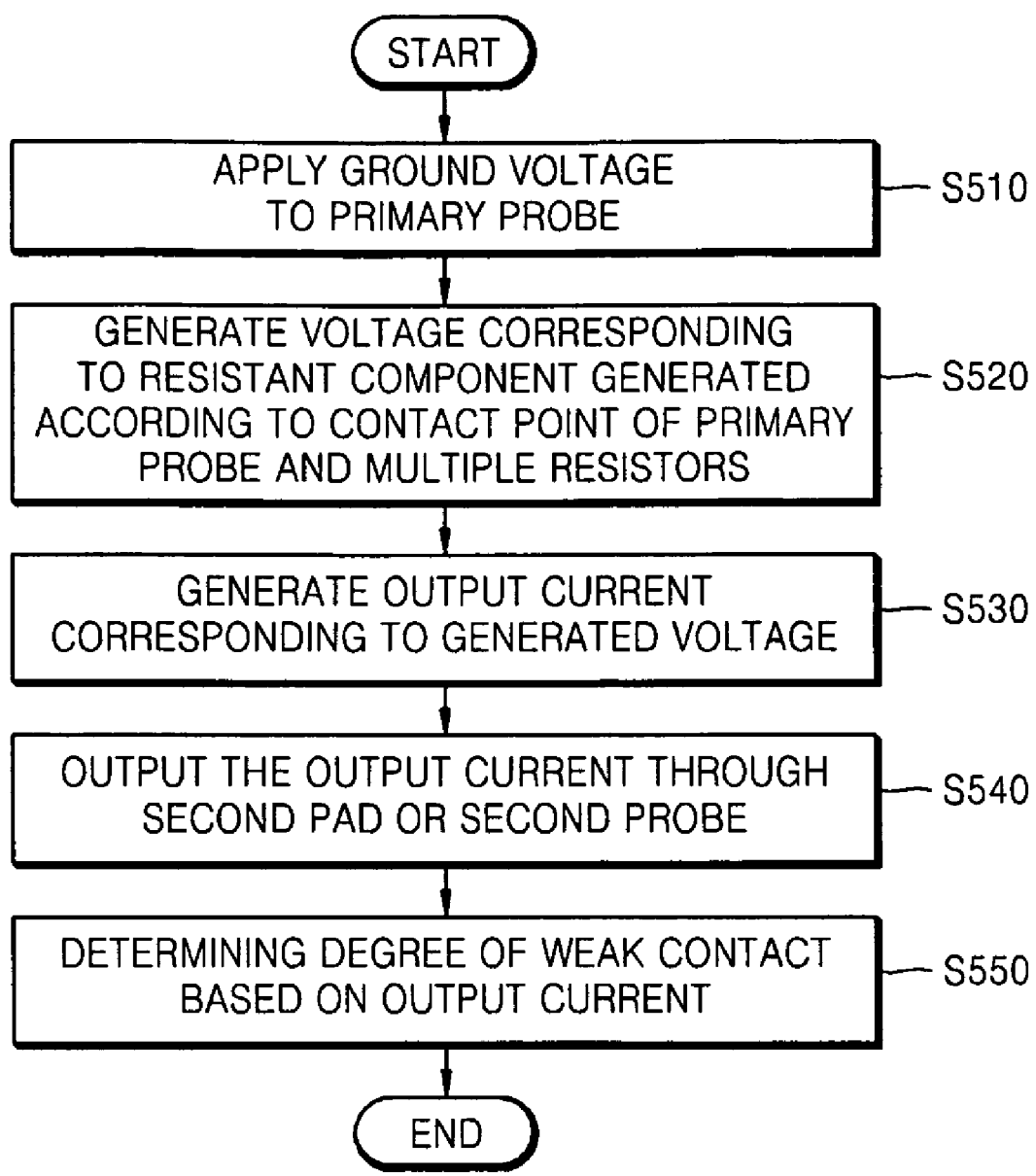
FIG. 5 illustrates a flow chart for testing the semiconductor memory device illustrated in FIG. 3 according to an example embodiment.

FIG. 5 illustrates a flow chart for testing the semiconductor memory device 200a illustrated in FIG. 3 according to an example embodiment.

Referring to FIGS. 3, 4 and 5, when a test is carried out, the test signal TEST in a first logic state may be applied to the controller 260. When the testing is not performed, the test signal TEST in a second logic state may be applied to the controller 260. The first logic state may correspond to logic high and the second logic state may correspond to logic low. Further, when the testing is not carried out, the transistor P260 may be turned on, and the transistor P320 may be turned off. Accordingly, there may be substantially no current output to the output terminal OUT. However, when the testing is performed, the transistor P260 may be turned off and the voltage of a positive terminal (+) of the comparator COM may be applied to the current generator 320.

The case in which the test signal TEST in the first logic state is applied to the controller 260 to perform the testing will now be explained.

Referring to FIG. 5, in operation S510, the ground voltage VSS may be applied to the primary probe 230 coming into contact with the sensor pad 210. The sensing unit 250 for determining weak contact may then generate an output current in response to the contact point of the primary probe 230. In particular, the output current may be generated when the voltage matching unit 310 generates a voltage that corresponds to the resistance (r) generated in response to the contact point of the primary probe 230 and the plurality of resistors R1 and R2 (S520). The voltage obtained by dividing the power supply voltage VDD using the resistors R1 and R2 and the resistor r may be applied to the negative input terminal (−) of the comparator COM. The comparator COM may compare the voltage input to the positive terminal (+) to the divided voltage input to the negative terminal (−). The output signal of the comparator COM may be applied to the gate of the transistor P310. The transistor P310 may be turned on or turned off in response to the output signal of the comparator COM. Further, depending on the status of the transistor P310, e.g., turned on or turned off, the voltage of the positive terminal (+) of the comparator COM may be compared to the divided voltage applied to the negative terminal (−) of the comparator COM. Thus, the voltage matching unit 310 may stably output the divided voltage.

The current generator 320 may then generate the output current corresponding to the output voltage of the voltage matching unit 310 (S530). The current generator 320 may apply the divided voltage to the gate of the transistor P320 to generate the output current. The output current may then be output through the pad 215_1 or the secondary probe 235_1 (S540).

The degree of weak contact may then be determined by measuring the output current (S550). The divided voltage, and thus, the output voltage of the voltage matching unit 310, may depend on the equivalent resistor r.

For example, in a normal condition (e.g., when the primary probe 230 comes into contact with the sensor pad 210), the equivalent resistor r may have a large value, so that the output voltage of the voltage matching unit 310 may be similar to the power supply voltage VDD. The output voltage of the voltage matching unit 310 may be applied to the gate of the transistor P320 and the current generator 320 may output a small current. When the output current of the current generator 320 (measured via the output terminal OUT), is small, the semiconductor memory device 200a may determine that the primary probe 230 and the secondary probe 235_1 may be normally contacting the pads 210 and 215_1, respectively.

Further, the output current may be varied according to the contact point of the primary probe 230, e.g., as the primary probe 230 approaches closer to the sensing region 212, the output current increases.

In an abnormal condition (e.g., when the primary probe 230 comes into contact with the sensing region 212), the equivalent resistor r may have a small value, and thus, the output voltage of the voltage matching unit 310 may be lower than the power supply voltage VDD as the output voltage corresponds to the divided voltage. Accordingly, the current generator 320 may output a current larger than the current output when the primary probe 230 normally comes into contact with the sensor pad 210. Further, as a consequence, the semiconductor memory device 200a may determine that the probes 230 and 235_1 abnormally come into contact with the pads 210 and 215_1, respectively, when the output current measured through the output terminal OUT is larger than the output current when the first probe 230 normally comes into contact with the sensor pad 210.

Further, when the primary probe 230 is electrically connected to the sensing region 212 (although the primary probe 230 comes in contact with the probe region 211) due to a substance, e.g., dust, existing on the sensor pad 210, the equivalent resistor r may have a resistance between the resistances of the normal condition and the abnormal condition. Thus, the voltage matching unit 310 may output a voltage between the output voltage obtained when the primary probe 230 normally comes into contact with the sensor pad 210 and the output voltage obtained when the primary probe 230 abnormally comes into contact with the sensor pad 210. Accordingly, the current generator 320 may generate a current between the current corresponding to the normal condition and the current corresponding to the abnormal condition.

Further, a threshold valve may be set when the output current generated during the normal condition and an impeding substance (i.e., dust) exists on the sensor pad 210, so as to determine whether the probes 230 and 235_1 have weak contacts, e.g., when the output current exceeds the threshold value, the sensing unit 250 may determine that the probes 230 and 235_1 may be in a weak contact (not properly aligned) with pads 210 and 215_1, respectively.

As a result, the semiconductor memory device 200a may determine the degree of weak contact of the probes 230 and 235_1 by measuring the output current.

Figure 6:
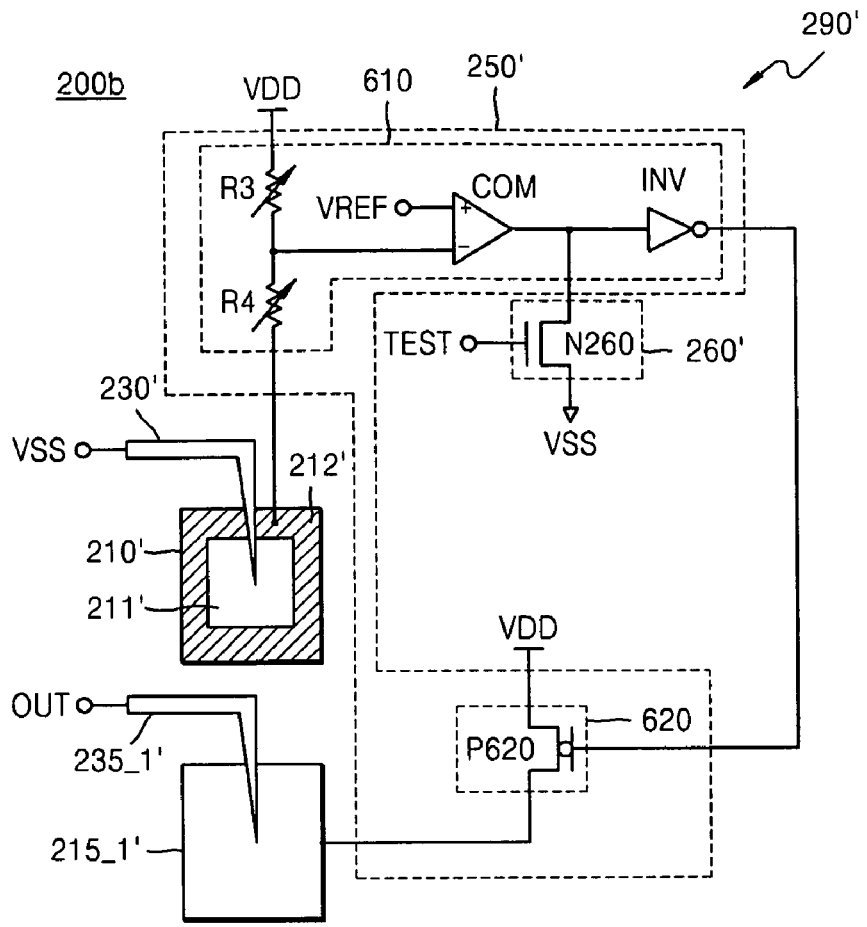
FIG. 6 illustrates a circuit diagram of a portion of the semiconductor memory device illustrated in FIG. 2 according to another example embodiment.

FIG. 6 illustrates a circuit diagram 290' of a portion of a semiconductor memory device 200b according to another example embodiment.

Referring to FIG. 6, the semiconductor memory device 200b may include a sensor pad 210', a pad 215_1', a sensing unit 250' for determining a weak contact and a controller 260'. The sensor pad 210', the pad 215_1' and the controller 260' may have the same function(s) as those of the semiconductor memory device 200a illustrated in FIG. 3 so that explanations thereof are omitted.

The sensing unit 250' for determining weak contact may generate an output current. The output current may be generated by comparing a first voltage, generated in response to a resistant component generated according to the contact point of the first probe 230' and a plurality of variable resistors R3' and R4', to a reference voltage VREF. The reference voltage VREF may be a basis for determining the weak contact. The output current may have a first logic state or a second logic state.

The sensing unit 250' may further include a voltage matching unit 610 and a current generator 620. The voltage matching unit 610 may compare the first voltage to the reference voltage VREF, and may output a voltage having the first logic state or the second logic state. The current generator 620 may generate the output current in the first logic state or the second logic state in response to the output voltage of the voltage matching unit 610.

The circuit configurations of the voltage matching unit 610 and the current generator 620 will now be explained in detail with reference to FIG. 7.

Figure 7:
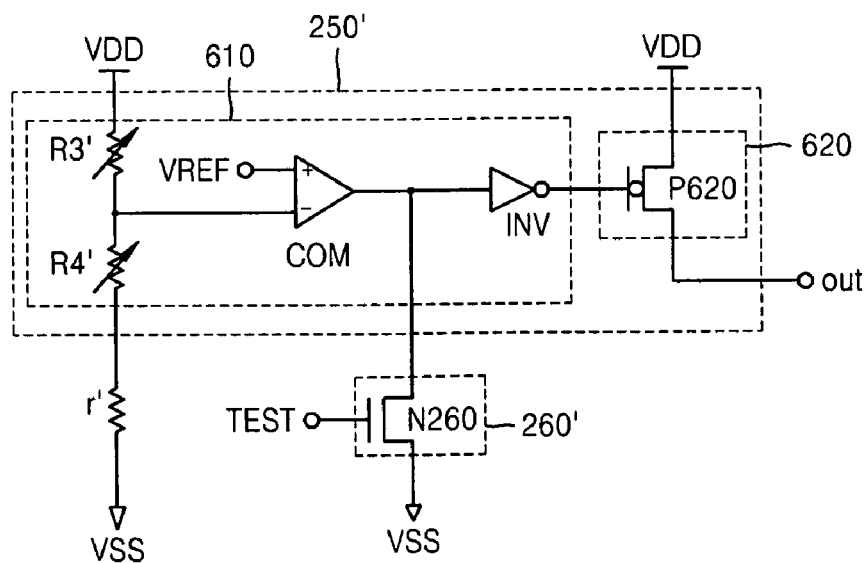
FIG. 7 illustrates an equivalent circuit diagram of the semiconductor memory device illustrated in FIG. 6.

FIG. 7 illustrates a portion of the circuit diagram 290' of the semiconductor memory device 200b, illustrated in FIG. 6. Referring to FIGS. 6 and 7, the equivalent resistor r' may be equivalent to the resistance (r) of the contact between the primary probe 230' and the sensor pad 210'. The equivalent resistor r' may be identical to the equivalent resistor r illustrated in FIG. 4 so that explanation thereof is omitted.

The voltage matching unit 610 may include the plurality of variable resistors R3' and R4', a comparator COM and an inverter INV. The plurality of variable resistors R3' and R4' and the equivalent resistor r' may be used to divide the power supply voltage VDD. The comparator COM may compare the first voltage corresponding to the divided voltage to the reference voltage VREF. The inverter INV may invert the output voltage of the comparator COM.

Accordingly, when the first voltage is applied to the positive terminal (+) of the comparator COM and the reference voltage VREF is applied to the negative terminal (−) of the comparator COM, the voltage matching unit 610 may perform the same operation as that of the voltage matching unit 310, illustrated in FIG. 4, that does not have the inverter INV. In this example embodiment, the controller 260' may be configured in the form of a transistor having a gate receiving the test signal TEST, a first terminal to which the power supply voltage VDD may be applied, and a second terminal connected to the output terminal of the comparator COM, as illustrated in FIG. 4.

The current generator 620 may include a transistor P620 that may receive the output voltage of the voltage matching unit 610, and may generate the output current, similarly to the current generator 320' illustrated in FIG. 4.

The controller 260" may include a transistor N620 having a gate to which the test signal TEST may be applied, a first terminal to which the ground voltage VSS may be applied, and a second terminal connected to the output terminal of the comparator COM and the input terminal of the inverter INV. In implementation, the transistor N260 may be an NMOS transistor.

Figure 8:
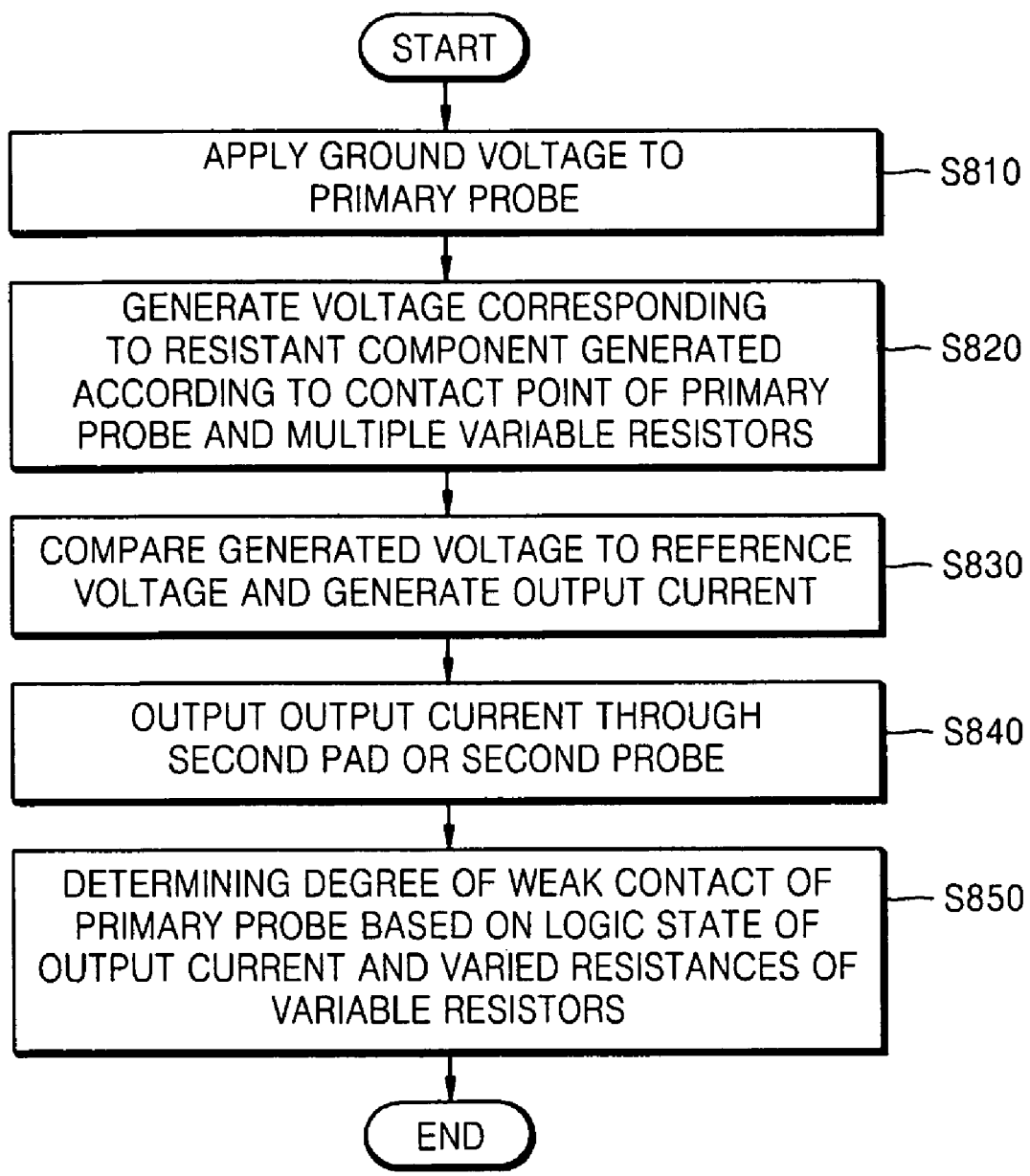
FIG. 8 illustrates a flow chart for testing the semiconductor memory device illustrated in FIG. 6 according to another example embodiment.

FIG. 8 illustrates a flow chart for testing the semiconductor memory device 200b illustrated in FIG. 6 according to another example embodiment. Referring to FIGS. 6 and 8, when a test is carried out, the test signal TEST having a second logic state may be applied to the controller 260'. When the testing is not performed, the test signal TEST having a first logic state may be applied to the controller 260'.

Further, when the testing is not performed, the transistor N260 may be turned on so that the output voltage of the voltage matching unit 610 may become the first logic state. Accordingly, the transistor P620 may be turned off so that there may be substantially no current output to the output terminal OUT. Further, when the testing is performed, the transistor N260 may be turned off and the inverted voltage of the output voltage of the comparator COM may be applied to the current generator 620. The case in which the test signal TEST having the second logic state is applied to the controller 260 to perform the test will now be explained.

Referring to FIG. 8, in operation S810, the ground voltage VSS may be applied to the primary probe 230' coming into contact with the sensor pad 210'. In operation S820, to generate the output current, the voltage matching unit 610 may generate a first voltage corresponding to the equivalent resistor component r', generated in response to the contact point of the primary probe 230' and the plurality of variable resistors R3' and R4'. The resistances of the variable resistors R3' and R4' may vary in response to a mode register set (MRS) signal. In operation S830, the comparator COM may compare the first voltage to the reference voltage VREF to generate the output current. Specifically, the comparator COM may output a voltage having the second logic state when the first voltage is higher than the reference voltage VREF, and may output a voltage having the first logic state when the first voltage is lower than the reference voltage VREF. The current generator 620 may generate the output current in the first or second logic state in response to the inverted signal of the output signal of the comparator COM. In operation S840, the output current may be output through the pad 215_1' or the probe 235_1'.

In operation S850, the degree of weak contact may then be determined according to the logic state of the output current and the resistances of the variable resistors R3' and R4'. In particular, the output current may be one of the first and second logic states, and the resistances of the variable resistors R3' and R4' (as well as the logic state of the output current) may be confirmed in order to determine the degree of weak contact of the probes 230' and 235_1'.

The term "weak contact" as illustrated in example embodiments defined herein, may relate to an alignment of the probes 230 and 235_x with the pads 210 and 215_x, respectively, and/or a contacting feature of the probes 230 and 235_x with the pads 210 and 215_x, respectively.

Accordingly, example embodiments relate to a method for testing a semiconductor memory device using a probe, and a semiconductor memory device using the same, to determine whether a probe abnormally comes into contact with a pad without requiring a separate channel for a sensor pad.

Other example embodiments relate to a method for testing a semiconductor memory device using a probe, and a semiconductor memory device using the same, to determine whether substances, e.g., dust, exist on the pad.

Other example embodiments relate to a method for testing a semiconductor memory device using a probe, and a semiconductor memory device using the same, to determine whether substances, e.g., dust, exist on the pad without requiring an additional channel, so as to prevent and/or reduce the indication of weak contact with the pad when the probe is normally in contact with the pad.

In the figures, the dimensions of layers and regions may be exaggerated for clarity of illustration. It will also be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, it will be understood that when a layer is referred to as being "under" or "above" another layer, it can be directly under or directly above, and one or more intervening layers may also be present. In addition, it will also be understood that when a layer is referred to as being "between" two layers, it can be the only layer between the two layers, or one or more intervening layers may also be present. Like numbers refer to like elements throughout. As used herein, the term "and/or" includes any and all combinations of one or more of the associated listed items.

It will also be understood that, although the terms "first" and "second" etc. (or "primary" and "secondary" etc.), may be used herein to describe various elements, structures, components, regions, layers and/or sections, these elements, structures, components, regions, layers and/or sections should not be limited by these terms. These terms are only used to distinguish one element, structure, component, region, layer and/or section from another element, structure, component, region, layer and/or section. Thus, a first (primary) element, structure, component, region, layer or section discussed below could be termed a second (secondary) element, structure, component, region, layer or section without departing from the teachings of example embodiments.

Spatially relative terms, such as "beneath," "below," "lower," "above," "upper" and the like, may be used herein for ease of description to describe one element or feature relationship to another element(s) or feature(s) as illustrated in the figures. It will be understood that the spatially relative terms are intended to encompass different orientations of the device in use or operation in addition to the orientation depicted in the figures. For example, if the device in the figures is turned over (or upside down), elements or layers described as "below" or "beneath" other elements or layers would then be oriented "above" the other elements or layers. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed:

1. A semiconductor memory device, comprising:
a first pad having a probe region and a sensing region, the first pad coming in contact with a primary probe;
a sensing unit connected to the sensing region for sensing a weak contact of the first pad and the primary probe, the sensing unit generating an output current in response to a contact point of the primary probe; and
a second pad adapted to come in contact with a secondary probe to input/output an electric signal,
wherein the output current of the sensing unit is output through the second pad or the secondary probe.

2. The semiconductor memory device of claim 1, wherein the sensing unit generates the output current in response to a first voltage corresponding to a voltage obtained by dividing a power supply voltage using a resistance component, generated in response to the contact point of the primary probe, and a plurality of resistors.

3. The semiconductor memory device of claim 1, wherein the sensing unit comprises:
a voltage matching unit outputting a voltage in response to the contact point of the primary probe; and
a current generator generating the output current corresponding to the output voltage of the voltage matching unit.

4. The semiconductor memory device of claim 3, wherein the voltage output from the voltage matching unit corresponds to a voltage obtained by dividing a power supply voltage using a resistance component, generated in response to the contact point of the primary probe, and a plurality of resistors.

5. The semiconductor memory device of claim 3, wherein the voltage matching unit comprises:
a plurality of resistors;
a comparator adapted to compare a voltage obtained by dividing a power supply voltage using a resistance component, generated in response to the contact point of the primary probe, and a plurality of resistors to the output voltage of the voltage matching unit; and
a transistor having a gate adapted to receive the output signal of the comparator, a first terminal to which the power supply voltage is applied, and a second terminal connected to a source of the ground voltage and an output terminal of the voltage matching unit.

6. The semiconductor memory device of claim 3, wherein the current generator includes a transistor having a gate adapted to receive the output voltage of the voltage matching unit, a first terminal to which a power supply voltage is applied, and a second terminal connected to the second pad.

7. The semiconductor memory device of claim 1, further comprising a controller adapted to control operation of the sensing unit in response to a test signal.

8. The semiconductor memory device of claim 7, wherein the controller includes a transistor having a gate receiving the test signal, a first terminal receiving a power supply voltage, and a second terminal connected to the output terminal of a voltage matching unit and an input terminal of a current generator.

9. The semiconductor memory device of claim 1, wherein the first pad is a sensor pad.

10. The semiconductor memory device of claim 1, wherein a ground voltage is applied to the primary probe.

11. The semiconductor memory device of claim 1, wherein the sensing unit compares a first voltage generated according to a resistance component in response to the contact point of the primary probe and a plurality of variable resistors, to a reference voltage, and generates the output current having a first logic state or a second logic state.

12. The semiconductor memory device of claim 11, wherein the first voltage corresponds to a voltage obtained by dividing a power supply voltage using the resistance component generated in response to the contact point of the primary probe and the plurality of variable resistors.

13. The semiconductor memory device of claim 11, wherein the sensing unit comprises:
a voltage matching unit adapted to compare the first voltage to the reference voltage and outputting a voltage having a first logic state or a second logic state; and
a current generator adapted to generate the output current having the first logic state or the second logic state in response to the output voltage of the voltage matching unit.

14. The semiconductor memory device of claim 13, wherein the voltage matching unit comprises:
a plurality of variable resistors;
a comparator adapted to compare the first voltage to the reference voltage.

15. The semiconductor memory device of claim 14, wherein the voltage matching unit further comprises an inverter inverting an output signal of the comparator.

16. A method for testing probe contact with a semiconductor memory device having a plurality of pads, comprising:
applying a voltage to a primary probe coming into contact with a first pad having a probe region and a sensing region;
generating an output current in a sensing unit connected to the sensing region in response to a contact point of the primary probe; outputting the output current through a second pad or a secondary probe coming into contact with the second pad; and determining whether a weak contact exists between the primary probe and the first pad based on the output current.

17. The method of claim 16, wherein generating of the output current comprises:
generating a voltage corresponding to the contact point of the primary probe; and
generating the output current corresponding to the generated voltage.

18. The method of claim 17, wherein generating of the voltage comprises dividing a power supply voltage according to a resistance component generated in response to the contact point of the primary probe and a plurality of resistors.

19. The method of claim 17, wherein generating of the output current includes applying the generated voltage to a gate of a transistor that generates the output current.

20. The method of claim 16, wherein determining whether the weak contact exists comprises determining that the primary probe is in a weak contact with the first pad when the output current is greater than a threshold value.

21. The method of claim 16, further comprising controlling the generating of the output current in response to a test signal.

22. The method of claim 16, wherein the first pad is a sensor pad having a probe region and a sensing region, and the second pad is a normal pad that inputs/outputs an electric signal to/from the semiconductor memory device.

23. The method of claim 16, wherein generating of the output current further comprises:

generating a voltage corresponding to a resistance component generated according to the contact point of the first probe and a plurality of variable resistors while varying the plurality of variable resistors; and comparing the generated voltage to a reference voltage and generating the output current in a first logic state or a second logic state.

24. The method of claim 23, wherein the generating of the output current further comprises applying the comparing result to a gate of a transistor and generating the output current accordingly through the transistor.

25. The method of claim 23, wherein the generating of the voltage comprises varying the resistance of the variable resistors in response to a mode register set (MRS) signal.

* * * * *